US011705717B2

(12) United States Patent
Wu et al.

(10) Patent No.: US 11,705,717 B2
(45) Date of Patent: Jul. 18, 2023

(54) GROUND FAULT CIRCUIT INTERRUPTER

(71) Applicant: Shanghai Fudan Microelectronics Group Company Limited, Shanghai (CN)

(72) Inventors: Chunyong Wu, Shanghai (CN); Yang Liu, Shanghai (CN); Lei Shen, Shanghai (CN); Shusen Hao, Shanghai (CN)

(73) Assignee: Shanghai Fudan Microelectronics Group Company Limited, Shanghai (CN)

( * ) Notice: Subject to any disclaimer, the term of this patent is extended or adjusted under 35 U.S.C. 154(b) by 451 days.

(21) Appl. No.: 16/853,708

(22) Filed: Apr. 20, 2020

(65) Prior Publication Data
US 2020/0350758 A1 Nov. 5, 2020

(30) Foreign Application Priority Data

Apr. 30, 2019 (CN) .......................... 201910362303.0

(51) Int. Cl.
*H02H 3/33* (2006.01)
*G01R 31/50* (2020.01)
(Continued)

(52) U.S. Cl.
CPC ............. *H02H 3/335* (2013.01); *G01R 31/50* (2020.01); *H02H 1/0007* (2013.01); *H02H 3/044* (2013.01); *H02H 3/162* (2013.01)

(58) Field of Classification Search
CPC ........ H02H 3/044; H02H 3/162; H02H 3/335; H02H 1/0007; G01R 31/50; G01R 31/52
(Continued)

(56) References Cited

U.S. PATENT DOCUMENTS 7,167,349 B2  1/2007 Asano et al.
7,221,548 B2  5/2007 Bauer
(Continued)

FOREIGN PATENT DOCUMENTS

CN   1045863 A    10/1990
CN   102315621 A   1/2012
(Continued)

OTHER PUBLICATIONS

First Chinese Office Action regarding Application No. 201910362303.0 dated Jan. 28, 2022. English translation provided by Unitalen Attorneys at Law.

*Primary Examiner* — Kevin J Comber
(74) *Attorney, Agent, or Firm* — Harness, Dickey & Pierce, P.L.C.

(57) ABSTRACT

A ground fault circuit interrupter is provided, including a main control chip, a tripping unit and a self-test detection unit, wherein the tripping unit is connected with the self-test detection unit at a detection point and coupled with a load circuit; the self-test detection unit is coupled with the main control chip, and configured to detect a signal at the detection point and output the signal to the main control chip; the main control chip is coupled with the self-test detection unit, and configured to in a self-test state, simulate a circuit fault, perform self-test, and determine whether the circuit fault could be detected and an alarm signal response to the circuit fault is generated, based on the signal. A self-test function and alarm function response to a circuit fault in a ground fault circuit interrupter can be tested during a final test of production.

5 Claims, 3 Drawing Sheets

(51) Int. Cl.
*H02H 3/16* (2006.01)
*H02H 3/04* (2006.01)
*H02H 1/00* (2006.01)

(58) Field of Classification Search
USPC .......................................................... 361/42
See application file for complete search history.

(56) References Cited

U.S. PATENT DOCUMENTS

| | | |
|---|---|---|
| 8,513,964 B2 | 8/2013 | Yue et al. |
| 2002/0180444 A1 | 12/2002 | Bauer |
| 2004/0233594 A1 | 11/2004 | Asano et al. |
| 2007/0030608 A1* | 2/2007 | Baldwin ................ H01H 83/04 361/42 |
| 2012/0007621 A1 | 1/2012 | Yue et al. |
| 2014/0285939 A1 | 9/2014 | Chen |
| 2017/0149235 A1* | 5/2017 | Cui ......................... H02H 3/338 |
| 2017/0184292 A1* | 6/2017 | Weeks .................. G01J 1/0407 |

FOREIGN PATENT DOCUMENTS

| | | |
|---|---|---|
| CN | 102324717 A | 1/2012 |
| CN | 103208776 A | 7/2013 |
| CN | 106229937 A | 12/2016 |
| CN | 108631263 A | 10/2018 |
| CN | 108879596 A | 11/2018 |
| EP | 1150412 A1 | 10/2001 |
| JP | 2004349063 A | 12/2004 |

* cited by examiner

GROUND FAULT CIRCUIT INTERRUPTER

CROSS-REFERENCE TO RELATED APPLICATIONS

This application claims the benefit of priority to Chinese Patent Application No. 201910362303.0, filed on Apr. 30, 2019, and entitled "GROUND FAULT CIRCUIT INTERRUPTER", the entire disclosure of which is incorporated herein by reference.

TECHNICAL FIELD

The present disclosure generally relates to circuit field, and more particularly, to a ground fault circuit interrupter.

BACKGROUND

Nowadays, to avoid safety issues caused by ground fault and the like at a load, a ground fault circuit interrupter (GFCI) is usually provided at a node which is connected with the load.

To test whether a function of the ground fault circuit interrupter is normal, the ground fault circuit interrupter is provided with a self-test function. By simulating a ground fault or a grounded neutral fault, it is detected whether components related to ground fault protection in the ground fault circuit interrupter are normal.

However, in the ground fault circuit interrupter, the self-test function itself cannot be detected, and whether a fault of the ground fault circuit interrupter can be detected by its own cannot be detected as well, which brings inconvenience to production tests. In a final test of production after the ground fault circuit interrupter is assembled, it is no longer possible to disassemble the ground fault circuit interrupter and artificially make a circuit fault to test whether the circuit fault could be found and alarm signal response to the fault is generated.

SUMMARY

In an embodiment, a ground fault circuit interrupter is provided, including a main control chip, a tripping unit and a self-test detection unit, wherein the tripping unit is connected with the self-test detection unit at a detection point and coupled with a load circuit; the self-test detection unit is coupled with the main control chip, and configured to detect a signal at the detection point and output the signal to the main control chip; the main control chip is coupled with the self-test detection unit, and configured to in a self-test state, simulate a circuit fault, perform self-test, and determine whether the circuit fault could be detected and an alarm signal response to the circuit fault could be generated, based on the signal.

Optionally, the main control chip includes a first pin and a second pin, wherein the first pin is coupled with the detection point, and the second pin is coupled with the self-test detection unit.

Optionally, the ground fault circuit interrupter further includes a silicon controlled rectifier coupled with the main control chip, wherein a gate of the silicon controlled rectifier is coupled with the first pin, an anode of the silicon controlled rectifier is coupled with the detection point, and a cathode of the silicon controlled rectifier is grounded.

Optionally, the ground fault circuit interrupter further includes a mutual inductance unit which includes a first mutual inductance coil and a second mutual inductance coil, wherein the first mutual inductance coil is coupled with the main control chip and configured to sense a residual current on the load circuit; the second mutual inductance coil is coupled with the main control chip; the main control chip includes a third pin and a fourth pin, and a connection line between the third pin and the fourth pin passes through the first mutual inductance coil and the second mutual inductance coil; and when the third pin and the fourth pin are internally short, an induced current is generated on the second mutual inductance coil and transmitted to the main control chip.

Optionally, the main control chip includes a fifth pin coupled with a detection switch, and after the detection switch is triggered, the main control chip enters the self-test state.

Compared with existing techniques, embodiments of the present disclosure have following advantages. In the ground fault circuit interrupter, the self-test detection unit is connected with the tripping unit at the detection point and coupled with the main control chip. In the self-test state, the main control chip simulates a circuit fault, performs self-test, and determines whether the self-test function is normal based on whether a level change on the detection point can be detected by the self-test detection unit and main control chip. With the ground fault circuit interrupter provided in the embodiments of the present disclosure, a self-test function and alarm function response to a circuit fault in a ground fault circuit interrupter can be tested during a final test of production.

DETAILED DESCRIPTION

To test whether a ground fault protection function of a ground fault circuit interrupter is normal, the ground fault circuit interrupter is usually provided with a self-test function. By simulating a ground fault or a grounded neutral fault, it is detected whether components related to ground fault protection in the ground fault circuit interrupter are normal, i.e., to detect whether residual current protection of the ground fault circuit interrupter is normal.

However, in a ground fault circuit interrupter, the self-test function itself cannot be detected, and whether a circuit fault of the ground fault circuit interrupter can be detected by its own cannot be detected as well, which brings inconvenience to production tests. In a final test of production after a ground fault circuit interrupter is assembled, it is no longer possible to disassemble the ground fault circuit interrupter and artificially make a circuit fault to test whether the circuit fault could be detected and an alarm signal response to the fault could be generated.

By embodiments of the present disclosure, in the ground fault circuit interrupter, the self-test detection unit is coupled with the main control chip, and is coupled to the tripping unit at the detection point. In the self-test state, the main control chip simulates a circuit fault, performs self-test, and determines whether the self-test function of the ground fault circuit interrupter is normal based on whether a level change on the detection point can be detected by the self-test detection unit and main control chip. With the ground fault circuit interrupter provided in the embodiments of the present disclosure, a self-test function and alarm function response to a circuit fault in a ground fault circuit interrupter can be tested during a final test of production.

In order to clarify the object, solutions and advantages of embodiments of the present disclosure, embodiments of present disclosure will be described explicitly in detail in conjunction with accompanying drawings.

Figure 1:
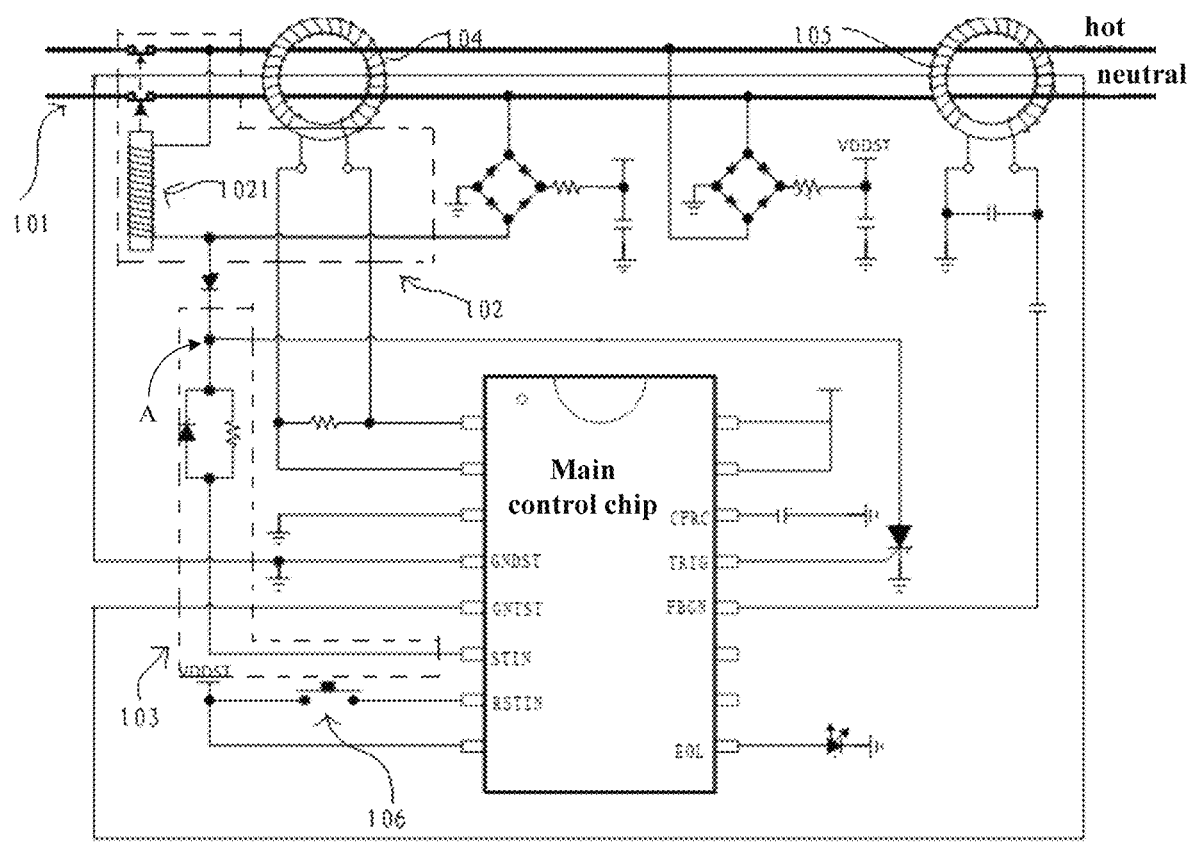
FIG. 1 schematically illustrates a structural diagram of a ground fault circuit interrupter according to an embodiment.

Referring to FIG. 1, in an embodiment, a ground fault circuit interrupter is provided. The ground fault circuit interrupter includes a main control chip, a tripping unit 102 and a self-test detection unit 103.

The tripping unit 102 is connected with the self-test detection unit 103 at a detection point A, and coupled with a load circuit 101. The self-test detection unit 103 is coupled with the main control chip, and configured to detect a signal at the detection point A and output the signal to the main control chip. The main control chip is coupled with the self-test detection unit 103, and configured to in a self-test state, simulate a circuit fault, perform self-test, and determine whether the circuit fault could be detected and an alarm signal response to the circuit fault could be generated, based on the signal.

In some embodiments, the signal detected at the detection point is a level signal.

In some embodiments, during normal operation of the ground fault circuit interrupter, when the tripping unit 102 receives a trip signal from a TRIG pin, the tripping unit 102 opens power supply of the load circuit 101.

In some embodiments, the tripping unit 102 may include a protection switch 1021. The protection switch 1021 may be a tripping element for opening the power supply of the load circuit 101.

In some embodiments, during normal operation of the ground fault circuit interrupter, the main control chip may monitor residual current on the load circuit 101, and when the residual current is greater than a set threshold, a logic high trip signal is triggered through the TRIG pin, so that the tripping unit 102 enables the protection switch 1021 to open the connection between the load circuit 101 and the power supply.

In some embodiments, the main control chip may periodically send a self-test signal in a negative half-cycle, and control the self-test detection unit 103 to detect whether a silicon controlled rectifier has been triggered during a self-test duration, thereby determining whether a residual current protection function of a ground fault circuit interrupter is normal. If the silicon controlled rectifier is not detected to be triggered during the self-test duration, it is determined that a circuit fault occurs in the ground fault circuit interrupter, and an EOL pin of the main control chip outputs an alarm signal indicating that there is a circuit fault in the ground fault circuit interrupter.

In some embodiments, the main control chip may simulate a circuit fault, perform the self-test, detect the fault during self-test duration, and output an alarm signal from the EOL pin to indicate that there is a circuit fault in the ground fault circuit interrupter. The circuit fault includes, but is not limited to, a fault that disables the residual current protection function of a ground fault circuit interrupter, or a fault that disables the detection function of the self-test detection circuit or a fault that cannot be responded to the grounded neutral fault.

In some embodiments, when the ground fault circuit interrupter is in a self-test state, the main control chip may simulate a circuit fault by simulating a neutral coil fault.

In some embodiments, the main control chip may simulate the circuit fault in other ways, for example, by holding a low level on a CFRC pin of the main control chip for detecting a residual current protection function. The CFRC pin is a pin connected to a filter capacitor for residual current.

In some embodiments, after the main control chip simulates the circuit fault, the signal at the detection point will not change during the self-test of the ground fault circuit interrupter. The self-test detection unit 103 outputs the signal to the main control chip. The signal of the self-test detection unit will not change yet. If the main control chip cannot detect a change of the signal, the EOL pin of the main control chip outputs an alarm signal by pulling up the EOL pin. In this case, by observing whether there is an alarm signal, it can be determined whether the self-test function and the alarm function response to the circuit fault of the ground fault circuit interrupter are normal.

In some embodiments, the load circuit 101 may be a two-phase AC power or a three-phase AC power.

In some embodiments, in addition to simulating the circuit fault and performing self-test in the self-test state, the main control chip also includes other functions.

In some embodiments, the main control chip includes a first pin and a second pin, wherein the first pin is coupled with the detection point A, and the second pin is coupled with the self-test detection unit 103.

In some embodiments, the ground fault circuit interrupter further includes a silicon controlled rectifier coupled with the main control chip, wherein a gate of the silicon controlled rectifier is coupled with the first pin, an anode of the silicon controlled rectifier is coupled with the detection point, and a cathode of the silicon controlled rectifier is grounded.

In some embodiments, the TRIG pin of the main control chip is the first pin which is configured to apply a trigger current to the gate of the silicon controlled rectifier to trigger the silicon controlled rectifier when a residual current is detected and a load should be disconnected from the power supply. The detection point is pulled down to a low level after the silicon controlled rectifier is conducted.

In some embodiments, an STIN pin of the main control chip is the second pin which is configured to receive the signal output from the self-test detection unit 103.

In some embodiments, the main control chip includes a fifth pin coupled with a detection switch 106, and after the detection switch is triggered, the main control chip simulates the circuit fault and enters the self-test state.

In some embodiments, an RSTIN pin of the main control chip is the fifth pin which is configured to cause the main control chip to simulate the circuit fault and enter the self-test state after the detection switch 106 is triggered, and determine whether a response to the circuit breaker is normal according to the signal received by the STIN pin.

In some embodiments, the detection switch 106 is activated so that the RSTIN pin is coupled with a power supply terminal VDDST to receive a logic high signal.

In some embodiments, the detection switch 106 may be activated via a button on the ground fault circuit interrupter, such as a reset button or a test button.

In some embodiments, a way to trigger the detection switch 106 to cause the main control chip to simulate the circuit fault and enter the self-test state may include activating the detection switch 106 twice or more continuously, or activating the detection switch 106 for a long time.

In some embodiments, the main control chip may simulate the circuit fault and enter the self-test state immediately after the detection switch 106 is triggered, or after a time period following the detection switch 106 being triggered, which may be set by a user according to actual situations.

In some embodiments, the ground fault circuit interrupter further includes a mutual inductance unit which includes a first mutual inductance coil 104 and a second mutual inductance coil 105. The first mutual inductance coil 104 is coupled with the main control chip and configured to sense a residual current on the load circuit 101, and the second mutual inductance coil 105 is coupled with the main control chip. The main control chip includes a third pin and a fourth pin, and a connection line between the third pin and the fourth pin passes through the first mutual inductance coil 104 and the second mutual inductance coil 105. When the third pin and the fourth pin are internally short, an induced current is generated on the second mutual inductance coil 105 and transmitted to the main control chip.

In some embodiments, both the first mutual inductance coil 104 and the second mutual inductance coil 105 surround a line and a neutral, and the line and neutral pass through an inner ring of the first mutual inductance coil 104 and the second mutual inductance coil 105.

In some embodiments, both terminals of the first mutual inductance coil 104 may be coupled with the main control chip to monitor a residual current on the load circuit 101.

In some embodiments, a GNDST pin is the third pin, a GNTST pin is the fourth pin, and a connection line between the third pin and the fourth pin passes through the first mutual inductance coil 104 and the second mutual inductance coil 105.

In some embodiments, when the GNDST pin and the GNTST pin are short by internal switch of the main control chip, a mutual inductance effect is generated between the first mutual inductance coil 104 and the second mutual inductance coil 105, which makes the two mutual coils and the main control chip form a positive feedback signal loop, and oscillation may occur within the loop. In response to the oscillation, the main control chip treats the oscillation as a grounded neutral fault, and outputs a trigger signal from the TRIG pin. Therefore, by shorting the GNDST pin and GNTST pin, a simulated grounded neutral fault is realized.

Figure 2:
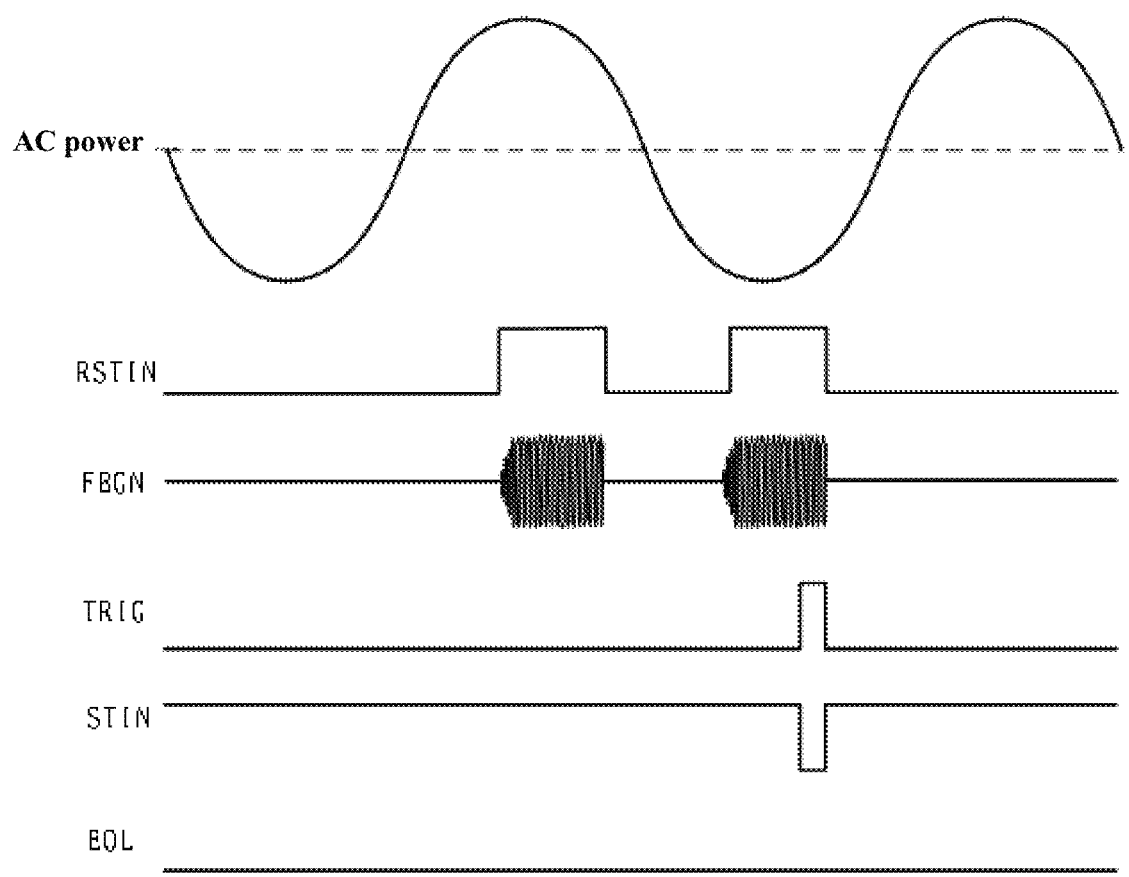
FIG. 2 schematically illustrates waveforms associated with the ground fault circuit interrupter as shown in FIG. 1 when it is in normal self-test according to an embodiment.

Referring to FIG. 2, FIG. 2 schematically illustrates waveforms associated with the ground fault circuit interrupter as shown in FIG. 1 when it is in normal self-test according to an embodiment. In some embodiments, when the ground fault circuit interrupter performs self-test, the main control chip shorts the GNDST pin and the GNTST pin by internal switch, so that mutual inductance is generated between the first mutual inductance coil and the second mutual inductance coil, and oscillation is generated on the FBGN pin of the main control chip, which causes the TRIG pin to output a high-level pulse and further triggers the silicon controlled rectifier to be conducted. In this way, the STIN pin receives a falling edge signal transmitted from the self-test detection unit 103, and accordingly the main control chip can confirm that the ground fault circuit interrupter operates normally.

Figure 3:
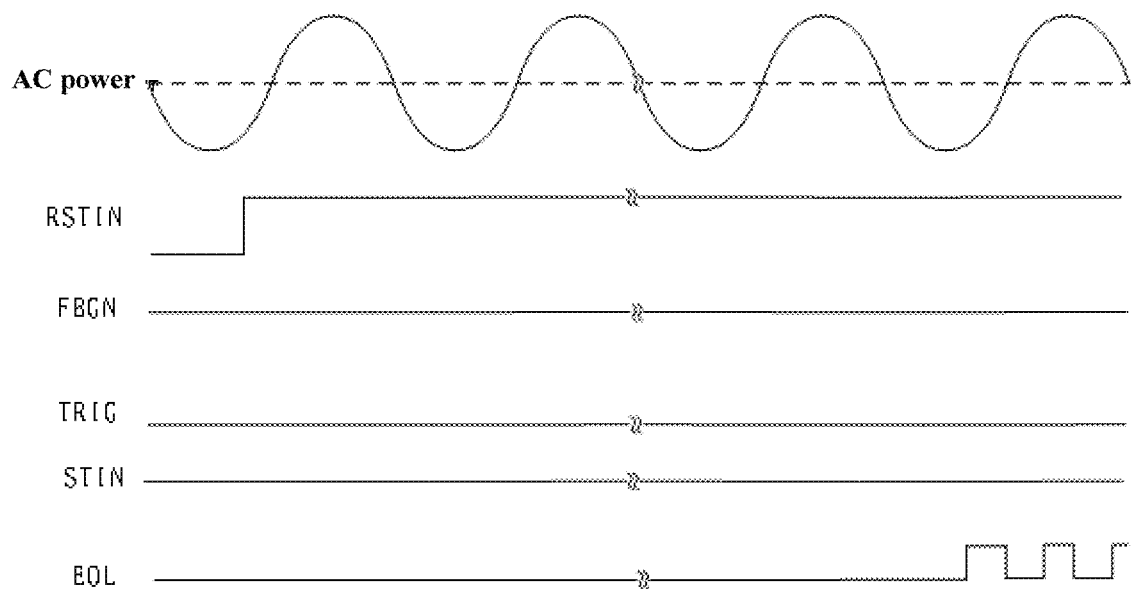
FIG. 3 schematically illustrates waveforms associated with the ground fault circuit interrupter as shown in FIG. 1 when it simulates a circuit fault and performs self-test according to an embodiment.

Referring to FIG. 3, FIG. 3 schematically illustrates waveforms associated with the ground fault circuit interrupter as shown in FIG. 1 when it simulates a circuit fault and performs self-test according to an embodiment.

In some embodiments, the detection switch 106 is triggered to cause the ground fault circuit interrupter to enter the self-test state. When detecting the alarm function response to a circuit fault, the main control chip simulates a grounded neutral fault, so that there is no short-circuit between the GNTST pin and the GNDST pin in detection mode. No mutual inductance is generated between the first mutual inductance coil 104 and the second mutual inductance coil 105, and thus oscillation is not generated on the FBGN pin. The TRIG pin remains a logic low, and the STIN pin remains a logic high. The main control chip cannot detect a level change at the STIN pin. After a preset time determined by the user, the main control chip outputs an alarm signal by pulling up the EOL pin. When the alarm signal is generated, it indicates that the self-test function and alarm function response to a circuit fault of the ground fault circuit interrupter are normal. If the main control chip does not generate an alarm signal, it indicates that the self-test function or alarm function response to a circuit fault of the ground fault circuit interrupter has failed.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A ground fault circuit interrupter, comprising: a main control chip, a tripping unit and a self-test detection unit,
wherein the tripping unit is connected with the self-test detection unit at a detection point and coupled with a load circuit;
the self-test detection unit is coupled with the main control chip, and configured to detect a signal at the detection point and output the signal to the main control chip;
the main control chip is coupled with the self-test detection unit, and configured to: in a self-test state, simulate a circuit fault, perform self-test, and determine whether the circuit fault could be detected and an alarm signal response to the circuit fault could be generated, based on the signal.

2. The ground fault circuit interrupter according to claim 1, wherein the main control chip comprises a first pin and a second pin, wherein the second pin is coupled with the self-test detection unit.

3. The ground fault circuit interrupter according to claim 2, further comprising a silicon controlled rectifier coupled with the main control chip, wherein a gate of the silicon controlled rectifier is coupled with the first pin, an anode of the silicon controlled rectifier is coupled with the detection point, and a cathode of the silicon controlled rectifier is grounded.

4. The ground fault circuit interrupter according to claim 3, further comprising a mutual inductance unit which comprises a first mutual inductance coil and a second mutual inductance coil,
wherein the first mutual inductance coil is coupled with the main control chip and configured to sense a residual current on the load circuit;
the second mutual inductance coil is coupled with the main control chip;
the main control chip comprises a third pin and a fourth pin, and a connection line between the third pin and the fourth pin passes through the first mutual inductance coil and the second mutual inductance coil; and when the third pin and the fourth pin are internally short, an induced current is generated on the second mutual inductance coil and transmitted to the main control chip.

5. The ground fault circuit interrupter according to claim 1, wherein the main control chip comprises a fifth pin coupled with a detection switch, and after the detection switch is triggered, the main control chip enters the self-test state.

\* \* \* \* \*